INVENTOR
THOMAS W. MOORE
BY
[signature]
ATTORNEY

INVENTOR
THOMAS W. MOORE
BY
Stewart F. Moore
ATTORNEY

United States Patent Office 3,295,089

Patented Dec. 27, 1966

3,295,089

SEMICONDUCTOR DEVICE

Thomas W. Moore, Dayton, Ohio, assignor to American Machine & Foundry Company, a corporation of New Jersey Filed Oct. 11, 1963, Ser. No. 315,647
11 Claims. (Cl. 338—204)

This invention relates to thermoconductive transmission devices and particularly to semiconductor devices utilized for electric transmission or translation purposes, such as rectification, amplification or switching, and to the processes for making them.

In the manufacture of an electrical semiconductor device, it is generally necessary to provide a construction which will maintain an effective thermal conduction to the ultimate heat sink for dissipating rapidly and efficiently the heat developed during the use of the device for its transmission or translation purpose. It is also necessary to provide means for avoiding excessive mechanical stresses due to differential expansion and contraction with temperature, of the component parts of the device when it is used for its transmission purpose. Such excessive stresses would tend to adversely affect the electrical performance of the device and ultimately destroy the soldered junction with the semiconductor crystal. Furthermore, as such a crystal is usually in the form of an extremely thin wafer, it is quite brittle and fragile and will break or shatter when it is subjected to appreciable mechanical stresses.

The expansion coefficient of copper normally used for a heat sink and mounting in such a device is around 17.7 parts per million per degree centigrade. The corresponding factor for monocrystalline silicon, for example, is around 4.6 parts per million per degree C. The net differential works out to 1.3 mils per 100° C. per inch diameter.

If it is desired to make a large surface, single junction semiconductor rectifier (of current-carrying capacity up to 1000 amperes or more), the largest available monocrystalline disc of semiconductor quality material, such as silicon, would be selected. This disc is currently about 1⅝ inches in diameter and for silicon would involve a differential expansion of 2.1 mils per 100° C. The solder for joining the crystal to the heat and electric conducting elements in the rectifier device would be applied at a temperature slightly over 300° C., and the junction should be free from excessive stress (after soldering) at −65° C., a total range of around 400° C. The total differential expansion is then around 8½ mils.

It is obvious that a thin layer of solder, such as, for example, 3 mils thickness in the case of a solid assembly, is incapable of lateral slippage of 8½ mils without rupture of the crystal or separation of the solder bond following one or more temperature excursions in the use of the device. If the solder film is made thick enough to tolerate a lateral slippage of this magnitude by plastic flow, it will add enough thermal and electrical resistance to create a serious problem in junction temperature. At such large semiconductor disc diameters and for such large currents, it will be necessary also to provide some means for resisting the mechanical stresses set up by the heavy copper heat sink section in the operation of the device and isolating them from the fragile semiconductor.

Prior art manufacturing techniques for constructing semiconductor devices of large current capacity to obviate such problems involve the use of relatively thick solder layers and/or an intermediate structure of heavy slugs of tungsten or molybdenum or alloys thereof with other materials, which have expansion characteristics somewhere in the neighborhood of 6 to 7 parts per million per degree centigrade, or close to that of silicon, mounted between the semiconductor crystal and the copper heat sink. Thick solder is low in thermoconductivity and subject to thermal fatigue. Molybdenum and tungsten are relatively expensive and are of limited thermoconductivity. Thus, their use in the semiconductor devices is not only a major item of expense but provides a relatively undesirable electrical and heat flow barrier. The expansion properties of these structures in the prior art devices are at best a compromise, and as the size of the semiconductor device increases, they become of progressively greater concern. Also, such expedients are effective only in semiconductor devices of limited current-carrying capacity.

A general object of the invention is to provide an efficient large size, semiconductor transmission device of new and improved form using relatively inexpensive materials for the component parts.

A related object is to produce economically a large size semiconductor transmission device having optimum electrical, heat dissipating and mechanical stress-resisting properties.

Another object is to provide electrical semiconductor transmission devices of larger current-carrying capacity than heretofore obtained.

A more specific object is to produce economically a semiconductor electrical transmission device of large current-carrying capacity having a construction such that the device may be operated over relatively long periods of time without any substantial change in its electrical or physical characteristics.

Another object is to produce economically a semiconductor transmission device of large current-carrying capacity incorporating means for rapidly and efficiently dissipating heat developed by its use and preventing development of mechanical stresses therein due to differential expansion such as to reduce its electrical performance and ultimately destroy its soldered junction with the semiconductor crystal.

Another object is a process for producing such a device economically.

These objects are attained in accordance with the invention by use of thin slices of a compressed bundle of copper wires (in a temporary jacket) inserted between the semiconductor crystal and blocks of copper forming the heat sink and electrical connection mounting, which slices are joined to the crystal and the copper blocks by a thin layer of solder applied thereto at a high temperature preferably in a hydrogen oven. The copper wires have good thermoconductivity in the direction of lay and are small enough to impose no differential expansion with temperature problems which in the use of the devices might cause mechanical stresses, reducing their electrical performance and ultimately destroying the solder junction. The wires may be preoxidized, plated or otherwise protected to restrict solder bonding to the end surfaces exclusively. The thickness of the slices are made such that angular movement of the external wires therein does not involve significant change in slab thickness. These features result in the production of efficient semiconductor devices of larger current-carrying capacity than heretofore considered possible.

The various objects and features of the invention will be better understood from the following detailed description thereof when it is read in connection with the accompanying drawings in which.

Figure 1:
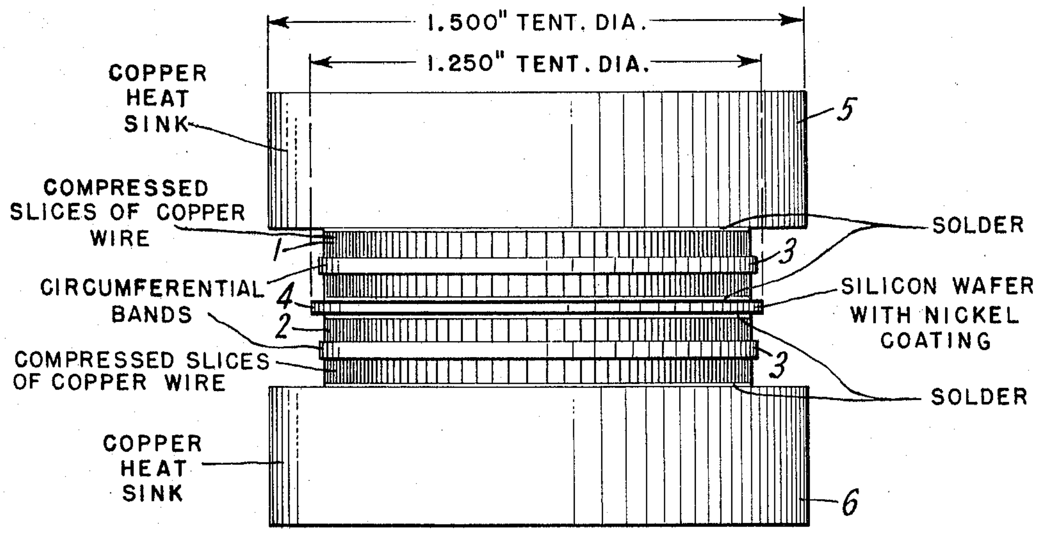
FIG. 1 is a vertical front view of an assembly of stacked component parts of a semiconductor device in accordance with the invention, prior to soldering or brazing in a hydrogen oven.
Figure 4:
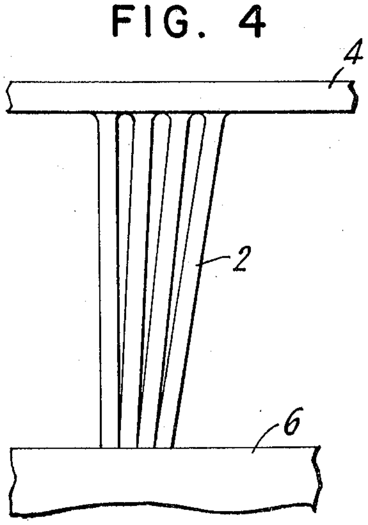
Figure 5:
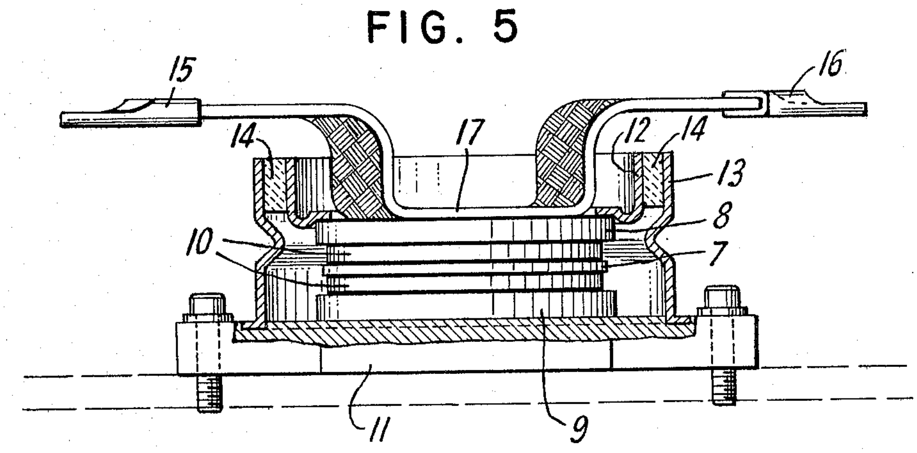
Figure 6:
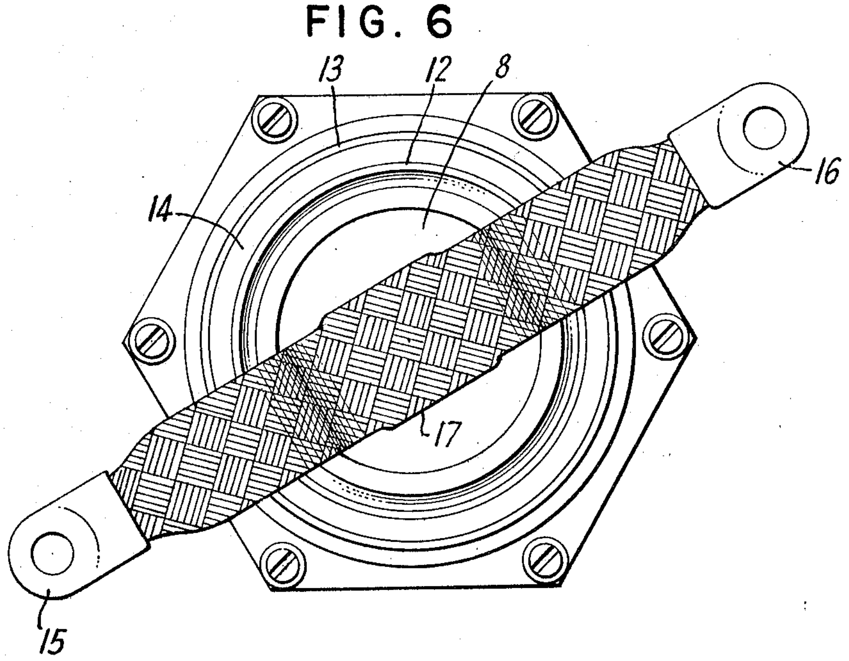

FIG. 4 is an enlarged front view of a portion of a slice of compressed bundle of copper wires connected to the semiconductor wafer and one of the copper blocks forming the heat sink of FIG. 1, after the brazing and soldering operations with the temporary banding removed; and FIGS. 5 and 6 are respectively a front view, partially in section, and a top view of a typical semiconductor rectifier made in accordance with the invention.

Figure 2:
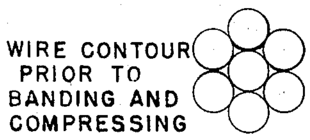
FIG. 2 is a diagrammatic end view of the contour of a bundle of parallel copper wires used in making the slices inserted between the semiconductor wafer and each copper block forming the heat sink and electrical mounting in the semiconductor device of FIG. 1, prior to banding, compression and slicing.

In the manufacture of semiconductor devices in accordance with the invention, the first step is to select a bundle of parallel copper wire conductors, which may be, for example, of about .005 to .006 inch in diameter, or #36 gauge wire. These conductors have been individually preoxidized, plated or otherwise coated to provide insulation to prevent solder wetting and cold-weld action of the cylindrical outer surfaces in the completed semiconductor device. Alternatively, silver wire conductors may be used. The wire contour of such a bundle is diagrammatically shown in FIG. 2.

Figure 3:
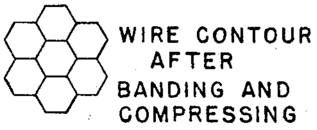
FIG. 3 is a diagrammatic end view of the contour of the wire bundle of FIG. 2, after compression and banding.

The selected wire bundle is provided with a thin circumferential metal band, which may be a thin tube of copper or other suitable metal, serving as a jacket to hold the wires together in the succeeding operations. The banded wire bundle is then compressed in a suitable press to remove all interstitial voids between the wires, as shown in FIG. 3. The compressed bundle of wires is then cut transversely into thin slices or in a direction perpendicular to the length of the wire or bundle. The thickness of the slices should be proportional to the diameter of the semiconductor crystal used in the semiconductor device and such that angular movement of external wires does not involve significant change in the thickness of such slice.

As shown in FIG. 1, slices 1 and 2 of compressed bundles of wires which are banded together by circumferential bands 3 are assembled between the upper and lower surfaces of a silicon or other suitable semiconductor crystal wafer 4, prepared in the manner as will be described below, and each of two copper blocks 5 and 6 forming the heat sink and electrical mounting sections of a semiconductor device. The semiconductor crystal disc 4 in the device as illustrated, by way of example, may have a diameter of 1.250 inches and each of the copper blocks 5 and 6 have a tentative diameter of approximately 1.500 inches.

The surfaces of the silicon or other semiconductor wafer 4 are roughened by a chemical etching technique, and then are provided with an evaporated layer of nickel or other suitable material which can be applied by plating, spraying or other suitable means. The crystal 4 so treated then is heated in an oven at a relatively high or elevated temperature for an extended period to diffuse the nickel deposit into the surfaces of the crystal to which it is applied.

A film of solder, which preferably has a high lead content (about 99%) and may contain a small amount of other suitable materials, such as silver or tin, is also disposed between the slices 1 and 2 of copper wire and the crystal 4 and the copper blocks 5 and 6 (FIG. 1), and the whole assembly is heated to a temperature of 300° C. in a hydrogen furnace to diffuse the solder into the surfaces of the crystal and the copper blocks. The nickel coating on the semiconductor crystal gives a little better high-strength bonding to the crystal proper. The general principle of this device is equally applicable to assembly procedures involving high temperature solders.

At the soldering temperature the copper heat sinks, comprising the blocks 5 and 6, expand at the same rate as the copper wires of the slices 1 and 2, and all elements are assembled to the metalized surface of the crystal 4.

As the device cools, all components cool uniformly, but the silicon or other semiconductor material crystal 4 does not contract to the same extent as each heat sink 5 and 6. The result is that the copper wires fan out to create individual voids therebetween adjacent the surfaces of the crystal, as indicated in FIG. 4 illustrating a portion of the wires between the semiconductor wafer 4 and a copper heat sink block 6 after the soldering or brazing operation with the temporary bands 3 removed therefrom.

The stress levels at each wire connection (ends only) are very small since the wire diameter is only about .005 inch and the differential expansion is around 25 microinches, a value easily absorbed by the elasticity of the wire and the solder film (which can now be optimally thin).

The semiconductor wafer 4 is now free to move irrespective of the differential expansion, the only requirement being the angular displacement of the outermost wires of the slices 1 and 2 does not cause enough shortening to create bending stresses. This can be assured by choosing an appropriate length of the wires in the slices. The thickness of each slice obviously will have to be a function of or proportional to the semiconductor diameter for optimized performance.

The potential advantages of this concept are considerable. There appears to be no practicable limit to the semiconductor wafer diameter used and thus the current-carrying capacity of the device insofar as expansion problems are concerned. Therefore, semiconductor devices of much larger current-carrying capacity than heretofore produced may be constructed in accordance with the invention. Assuming a solder contact for each of the wire ends, the effective cross section of the thermal conductor can be in excess of 90 percent of that of solid copper. All materials used in the semiconductor devices made in accordance with the invention are readily available and are relatively inexpensive. The residual cost of producing semiconductor devices of large size is accordingly mostly labor cost rather than the cost of purchased parts.

A typical assembly utilizing the elements of FIG. 1 is illustrated in approximate scale in FIGS. 5 and 6. As shown, it includes an inner structure comprising a wafer or disc 7 of silicon or other high quality semiconductive material having an outer evaporated coating of nickel or other suitable metal material diffused into its opposite outer surfaces, two blocks 8 and 9 of copper forming the thermoconductive and electrical connection means; and a thermoconductive and electrical coupling means between the semiconductor wafer and the copper blocks comprising slices 10 of a compressed bundle of pre-oxidized copper wires which are brazed or soldered thereto by an appropriate alloy applied at high or an elevated temperature preferably in a hydrogen oven to provide means for dissipating heat developed by its use as a rectifier and isolating the mechanical stresses caused by such use from the fragile semiconductor crystal. The inner structure is supported by and affixed to a base 11 of copper and is surrounded by a casing, which is welded, brazed or soldered to the copper base 11, having outer shells 12, 13 separated by brazed ceramic insulators 14. Electrical connecting elements 15 and 16 are connected by a strap 17 of silver-plated copper braid which makes electrical connection to the rectifier device through the upper copper block 8. The screws shown on the assembly of FIGS. 5 and 6 are for pressure contact to the radiating structure (plate shown in dotted lines of FIG. 5), and they will provide contact pressure for electrical, mechanical, and thermal functions.

In smaller rectifiers it is frequently desirable to electrically insulate the device from the heat radiator. In the large units the necessity for optimum heat flow will require that the radiator element be physically in contact with the rectifier and the radiator element will be insulated from its support. Intermediate ratings, depending upon application details, will be a scaled up version of the small stud model. Where weight and volume are of major concern, or where it is desirable to mount and connect from one side only, the "button" type of structure will be preferred.

Performance degradation in the semiconductor devices, as well as destruction of the devices where mechanical stresses due to differential expansion are not enough to cause actual rupture or cracking of the crystals, are substantially prevented in the arrangements of the invention.

The arrangements of the invention may be used in connection with other semiconductor devices, for example, transistors, high power integrated circuits, multiple rectifiers and semi-conductors materials other than silicon to take care of similar problems. Various other modifications of the semiconductor devices and processes illustrated and described which are within the spirit and scope of the invention will occur to persons skilled in the art.

What is claimed is:

1. In combination in a semiconductor transmission device, a wafer member of semiconductive material, a base member and connection means disposed between said members and comprising a plurality of discrete wire conductors, means for attaching one end of each of said conductors to said base member in thermal and electrical conducting relation therewith and each of the other ends thereof separately to a selected area on the surface of said semiconductive material, said conductors being separable from each other and adapted to move individually with the thermal expansion and contraction of the component parts of said device in its transmission use without appreciable change in the electrical performance and physical characteristics of said device.

2. The combination of claim 1, in which the semiconductive material of said wafer member and the material of said base member each have a coefficient of expansion different from that of the other, the material of said discrete conductors and the dimensions thereof relative to those of said wafer and base members being such as to limit and minimize mechanical stresses between said members as a result of differential expansion and contraction of the component parts of the device.

3. The combination of claim 1, in which the thickness of said connection means is proportional to the diameter of said wafer and the lengths of the wire conductors thereof are sufficient to limit the angular displacement of the wires disposed toward the periphery of the connecting means during the transmission use of said device to prevent creation of appreciable bending stresses on said wafer member.

4. The combination of claim 1, in which the coefficients of expansion of the material of said base member and said discrete conductors are substantially the same and each is at least three times that of said semiconductive material in said wafer member.

5. The combination of claim 1, in which the semiconductive material is monocrystalline silicon, the material of the base member and the discrete conductors is copper, and the length of each of said conductors is selectively proportional to the area of said wafer member to permit differential expansion and contraction of said members.

6. The combination of claim 1, in which the base member is a heat sink for the semiconductor device, and the means for attaching the ends of said conductors to said wafer member and to said base member are films of solder of high lead content applied to said ends at an elevated temperature.

7. In combination in a semiconductor device, a substantially thin sheet of semiconductive material, a base member and a plurality of discrete conductors, one end of said conductors being attached to said base member in thermal and electrical conduction relation therewith, each of the other ends of said conductors each being separately attached to a selected area on the surface of said semiconductive material, a fusible material attaching the ends of said conductors to said base and semiconductive material and providing an electrical and thermal transmission bond therebetween.

8. In combination in a semiconductor transmission device, a wafer member of semiconductive material, a base member of an electrical and thermal conductive material, an intermediate connection between said wafer and base members comprising a plurality of wire conductors and means for maintaining said wire conductors in compressed relationship to each other, means for attaching one end of each of the compressed wire conductors to said base member in thermal and electrical conduction relation therewith and each of the other ends of the compressed conductors to a selected area on the surface of said semiconductive material, said conductors being separate from each other between the attached ends thereof and free to move individually with the thermal expansion and contraction of the component parts of said device during transmission use thereby with the absence of introducing mechanical stresses to prevent appreciable change of the electrical performance and physical characteristics of the device.

9. In combination in an electrical semiconductor transmission device, a semiconductor wafer member, a pair of metal blocks singly disposed on opposite sides of said member and forming heat-sink and electrical-mounting members, supporting means respectively positioned between said wafer and a different one of said blocks, said supporting means each comprising a compressed bundle of thermal and electrical wire conductors of substantially small diameter relative to that of said members and individually insulated from each other, fusible metal for respectively attaching the opposite ends of the wire conductors of each of said supporting means to opposite surfaces of said wafer member and to the opposed surface of a different one of said blocks to provide thermal and electrical conduction between said wafer member and said blocks.

10. The combination of claim 7, in which said film comprises solder having a high lead content, and said conductors in each of said supporting means are formed from copper wire of the order of about .005 inch in diameter.

11. The combination of claim 10, in which the thickness of said supporting means is proportional to the diameter of said semiconductor wafer and, the wire conductors in said supporting means are of sufficient length to limit the angular displacement of the wires disposed toward the periphery of each supporting means during use of said device to prevent creation of appreciable bending stresses acting on said semiconductor wafer.

References Cited by the Examiner

UNITED STATES PATENTS

| | | | |
|---|---|---|---|
| 2,321,071 | 6/1943 | Ehrhardt et al. | 29—155.5 |
| 2,752,541 | 5/1956 | Losco | 317—234 |
| 2,793,420 | 5/1957 | Johnston | 29—155.5 |
| 2,806,187 | 9/1957 | Boyer et al. | 165—185 X |
| 2,977,558 | 3/1961 | Hampton | 338—22 |
| 2,978,661 | 4/1961 | Miller et al. | 338—22 |
| 3,128,419 | 4/1964 | Waldkotter et al. | 165—185 X |
| 3,176,382 | 4/1965 | Dickson et al. | 29—155.5 |
| 3,204,158 | 8/1965 | Schreiner et al. | 317—234 |

FOREIGN PATENTS

| | | |
|---|---|---|
| 1,057,241 | 5/1959 | Germany. |

RICHARD M. WOOD, *Primary Examiner.*

ANTHONY BARTIS, *Examiner.*

V. Y. MAYEWSKY, W. D. BROOKS, *Assistant Examiners.*